United States Patent
Urteaga et al.

(10) Patent No.: US 11,575,020 B2
(45) Date of Patent: Feb. 7, 2023

(54) METHOD OF FORMING A BIPOLAR TRANSISTOR WITH A VERTICAL COLLECTOR CONTACT

(71) Applicant: Teledyne Scientific & Imaging, LLC, Thousand Oaks, CA (US)

(72) Inventors: Miguel Urteaga, Moorpark, CA (US); Andy Carter, Thousand Oaks, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 151 days.

(21) Appl. No.: 16/908,117

(22) Filed: Jun. 22, 2020

(65) Prior Publication Data
US 2021/0399115 A1 Dec. 23, 2021

(51) Int. Cl.
*H01L 29/417* (2006.01)
*H01L 29/66* (2006.01)
*H01L 21/321* (2006.01)
*H01L 21/8252* (2006.01)

(52) U.S. Cl.
CPC .... *H01L 29/66318* (2013.01); *H01L 21/3212* (2013.01); *H01L 21/8252* (2013.01)

(58) Field of Classification Search
IPC .................................................. H01L 27/0823
See application file for complete search history.

(56) References Cited

U.S. PATENT DOCUMENTS

| 10,515,872 B1* | 12/2019 | Li | H01L 29/7371 |
| 2004/0048447 A1* | 3/2004 | Kondo | H01L 21/30612 438/458 |
| 2004/0253782 A1* | 12/2004 | Kondo | H01L 29/7395 438/222 |
| 2012/0068157 A1* | 3/2012 | Kub | H01L 29/1606 257/15 |
| 2014/0042447 A1 | 2/2014 | Nie et al. | |
| 2016/0293742 A1* | 10/2016 | Watanabe | H01L 29/66242 |

FOREIGN PATENT DOCUMENTS

| JP | 2013-191655 A | 9/2013 |
| JP | 2015-141961 A | 8/2015 |
| JP | 2016-219682 A | 12/2016 |
| WO | WO2019/208294 A1 | 10/2019 |

OTHER PUBLICATIONS

International Search Report and Written Opinion in International Application PCT/US2021/035914 dated Aug. 11, 2021.

* cited by examiner

*Primary Examiner* — Benjamin P Sandvik
(74) *Attorney, Agent, or Firm* — M.J. Ram & Associates

(57) ABSTRACT

A method of forming a bipolar transistor with a vertical collector contact requires providing a transistor comprising a plurality of epitaxial semiconductor layers on a first substrate, and providing a host substrate. A metal collector contact is patterned on the top surface of the host substrate, and the plurality of epitaxial semiconductor layers is transferred from the first substrate onto the metal collector contact on the host substrate. The first substrate is suitably the growth substrate for the plurality of epitaxial semiconductor layers. The host substrate preferably has a higher thermal conductivity than does the first substrate, which improves the heat dissipation characteristics of the transistor and allows it to operate at higher power densities. A plurality of transistors may be transferred onto a common host substrate to form a multi-finger transistor.

22 Claims, 5 Drawing Sheets

METHOD OF FORMING A BIPOLAR TRANSISTOR WITH A VERTICAL COLLECTOR CONTACT

GOVERNMENT RIGHTS

This invention was made with Government support under contract FA865018C7808 awarded by Department of Defense (DoD) Defense Advanced Research Projects Agency (DARPA). The Government has certain rights in this invention.

BACKGROUND OF THE INVENTION

Field of the Invention

This invention relates generally to bipolar transistors, and more particularly to methods of forming bipolar transistors with vertical collector contacts.

Description of the Related Art

Thermal management is a constant problem for integrated bipolar transistors, especially when employed as part of a power amplifier. For example, power density (W/cm$^2$) in heterojunction bipolar transistor (HBT) based power amplifiers and mixed-signal circuits is often limited by thermal considerations; HBT junction temperature is typically required to remain below a pre-determined temperature for reliable operation or to meet specified performance criteria.

Conventional HBTs typically employ a structure in which lateral base contacts are on either side of an emitter contact, and lateral collector contacts are located outside of the base contacts. This arrangement results in a large footprint and active semiconductor device area must be removed to support these lateral contacts. Additionally, the collector resistance through the sub-collector semiconductor layer to the contact (known as "collector access resistance") adversely impacts the RF performance and efficiency of multi-finger HBTs.

SUMMARY OF THE INVENTION

A method of forming a bipolar transistor with a vertical collector contact is presented, which enables operation at higher power densities with a compact device footprint.

The present method requires providing a transistor comprising a plurality of epitaxial semiconductor layers on a first substrate, and providing a host substrate. A metal collector contact is patterned on the top surface of the host substrate, and the plurality of epitaxial semiconductor layers is then transferred from the first substrate onto the metal collector contact on the host substrate. In a preferred embodiment, the plurality of epitaxial semiconductor layers form a heterojunction bipolar transistor (HBT).

The first substrate is suitably the growth substrate for the plurality of epitaxial semiconductor layers. The host substrate preferably has a higher thermal conductivity than does the first substrate, which improves the heat dissipation characteristics of the transistor and allows it to operate at higher power densities when compared with conventional designs.

A plurality of transistor fingers comprised of an array of emitter and base contacts may be transferred onto a common host substrate to form a multi-finger transistor. The transistors may be transferred onto a common metal collector contact which has been patterned on the top surface of the host substrate.

In one embodiment, the metal collector contact is embedded in openings which have been patterned and etched in an electrically insulating dielectric layer on the surface of the host substrate, such that the surface of the collector contact is approximately level with the top surface of the dielectric layer. In another embodiment, an opening is etched into the top surface of the host substrate, and the metal collector contact is formed in the opening.

These and other features, aspects, and advantages of the present invention will become better understood with reference to the following drawings, description, and claims.

DETAILED DESCRIPTION OF THE INVENTION

Figure 1:
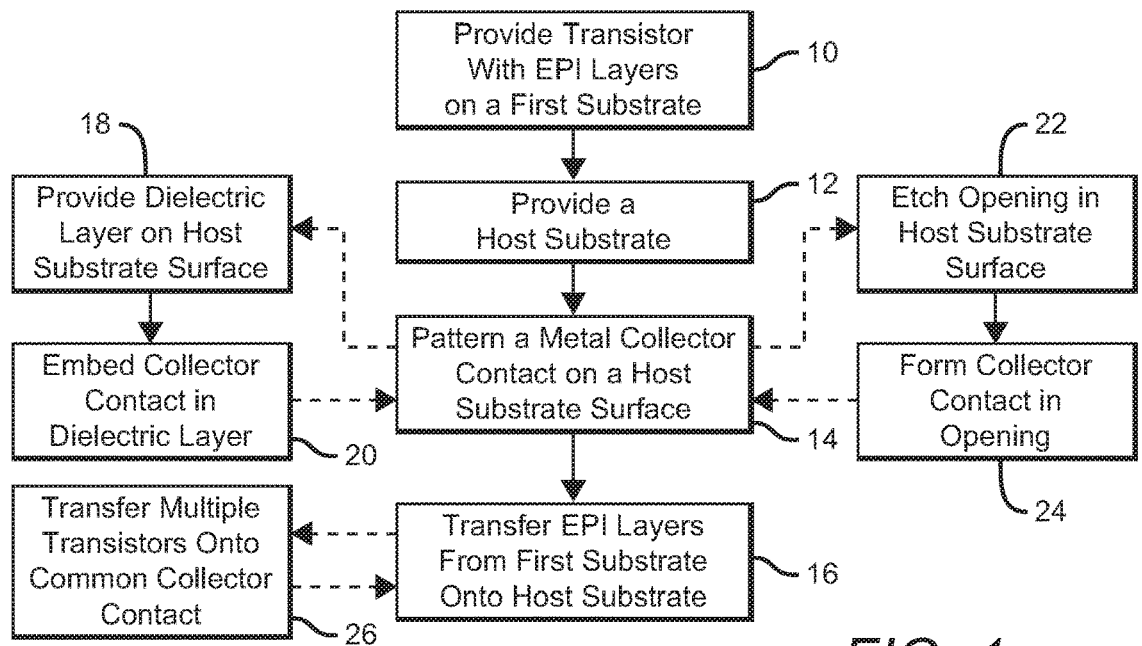
FIG. 1 is a flow diagram illustrating one possible embodiment of the present method.

One embodiment of the present method of forming a bipolar transistor with a vertical collector contact is illustrated in FIG. 1. A transistor comprising a plurality of epitaxial semiconductor layers (also referred to herein as "epi layers") on a first substrate is provided (step 10). A host substrate is also provided (step 12). A metal collector contact is patterned on the top surface of the host substrate (14), and the plurality of epitaxial semiconductor layers from the first substrate is transferred directly onto the metal collector contact on the host substrate (step 16). In this way, the metal collector contact serves as a vertical collector contact for the transistor.

This process may be advantageously used to maximize semiconductor utilization on the first substrate. Discrete transistors or multi-finger transistor structures can be fabricated on the first substrate at a high packing density. These transistors can be transferred onto the host substrate with patterned metal collector contacts at a reduced density for a given integrated circuit design. For circuit designs such as high-frequency RF power amplifiers, the active device array may take up <1% of the total circuit area. With proper design, multiple host substrates can be populated with transistors from a single starting substrate with epitaxial layers. This approach offers potential for considerable cost savings as epitaxy growth and transistor fabrication costs are a significant portion of the integrated circuit fabrication cost. Additionally, the performance of the transferred transistor may be improved. For example, heterojunction bipolar transistors (HBTs) transferred to a host substrate having a metal collector contact patterned on its top surface will have improved thermal performance if the host substrate is properly chosen.

There are several ways in which the metal collector contact may be formed on the top surface of the host substrate (step 14), which is preferably planar. For example, as shown in step 18, an electrically insulating dielectric layer can be formed on the surface of the host substrate. The metal collector contact may then be embedded in the dielectric layer (step 20), preferably such that the surface of the contact is approximately level with the top surface of the dielectric layer. Here, the electrically insulating dielectric layer is preferably patterned and etched to form an opening, and metal is deposited into the opening to form the metal collector contact. Alternatively, an opening can be etched into the said top surface of the host substrate (step 22), and the metal collector contact formed in the opening (step 24).

The present method may also be used to form multi-finger transistors. For example, as shown in step 26, a plurality of transistors may be transferred onto a common metal collector contact which has been patterned on the top surface of the host substrate, so as to form a multi-finger transistor.

Figure 2A:
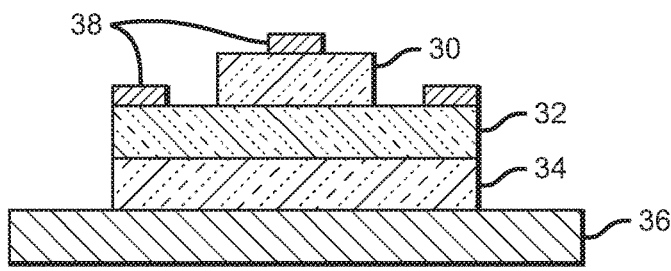
FIG. 2A is a sectional view of a plurality of epitaxial semiconductor layers on a first substrate.
Figure 2B:
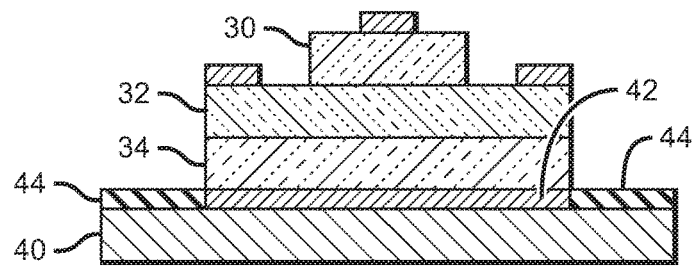
FIG. 2B is a sectional view of the plurality of epitaxial semiconductor layers in FIG. 2A after being transferred to a host substrate in accordance with the present method.

Exemplary devices produced by various embodiments of the present method are now discussed. For example, in FIG. 2A, the plurality of epitaxial semiconductor layers comprise emitter 30, base 32, and collector 34 layers, on a first substrate 36; electrical contacts to the emitter and base layers, such as contacts 38, may also be present. In accordance with the present method, epi layers 30, 32, and 34 are transferred to a host substrate 40 on which a metal collector contact 42 has been formed; this structure is shown in FIG. 2B. Note that contacts 38 may be formed before or after the transfer of the epitaxial semiconductor layers to host substrate 40.

Figure 2C:
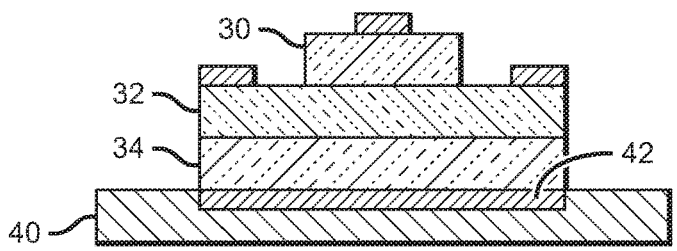
FIG. 2C is a sectional view of the plurality of epitaxial semiconductor layers in FIG. 2A after being transferred to a host substrate using another embodiment of the present method.

In the example shown in FIG. 2B, an electrically insulating dielectric layer 44 is formed on the top surface of host substrate 40, and the metal collector contact 42 is embedded in the dielectric layer, preferably such that the surface of the contact is approximately level with the layer's top surface. For this embodiment, dielectric layer 44 is preferably patterned and etched to form an opening, and metal is deposited into the opening to form metal collector contact 42. Alternatively, as shown in FIG. 2C, an opening can be etched into the top surface of host substrate 40, and metal collector contact 42 formed in the opening. The collector layer 34 suitably comprises N⁻ material, and the arrangement of collector layer directly on metal collector contact 42 forms a Schottky contact at their interface.

Figure 3A:
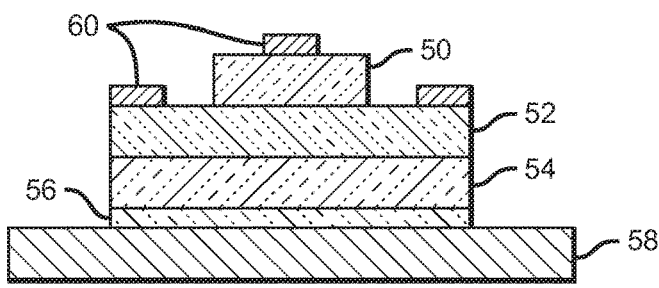
FIG. 3A is a sectional view of a plurality of epitaxial semiconductor layers including a sub-collector layer on a first substrate.
Figure 3B:
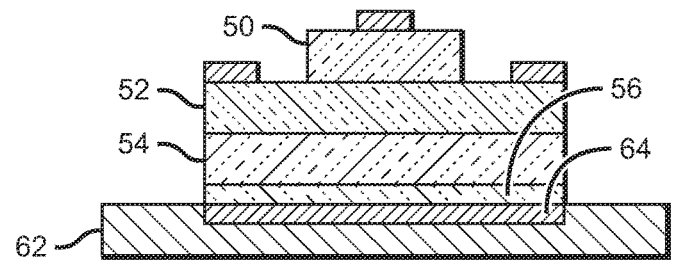
FIG. 3B is a sectional view of the plurality of epitaxial semiconductor layers in FIG. 3A after being transferred to a host substrate in accordance with the present method.

Another embodiment is illustrated in FIGS. 3A and 3B. In FIG. 3A, the plurality of epitaxial semiconductor layers comprise emitter 50, base 52, collector 54, and sub-collector 56 layers on a first substrate 58; electrical contacts to the emitter and base layers such as contacts 60 may also be present. In accordance with the present method, layers 50, 52, 54, and 56 are transferred to a host substrate 62 on which a metal collector contact 64 has been formed; this structure is shown in FIG. 3B. In this example, collector contact 64 is formed in an opening etched into the top surface of host substrate 62, though the collector contact might alternately be embedded in an electrically insulating dielectric layer as discussed above in connection with FIG. 2B. The sub-collector layer 56 suitably comprises $N^{++}$ material, and the arrangement of the sub-collector layer directly on metal collector contact 42 forms an ohmic contact at their interface.

The host substrate preferably has a higher thermal conductivity than does the first substrate, which improves the heat dissipation characteristics of the transistor. A metal collector contact on a high thermal conductivity substrate can dramatically improve near junction heat-sinking of a transistor such as an HBT, allowing for operation at higher power densities (W/cm²) when compared with conventional designs. This enables a device produced in accordance with the present method to have a more compact footprint than existing designs, or to provide more performance (output power or functionality) in a constrained area. Suitable materials for the host substrate include silicon (Si), silicon carbide (SiC), aluminum nitride (AlN), or diamond.

The plurality of epitaxial semiconductor layers referred to in step 10 of FIG. 1 preferably comprises Group III-V materials. For example, the plurality of epitaxial semiconductor layers may comprise a combination of: indium phosphide (InP), indium gallium arsenide (InGaAs), indium aluminum arsenide (InAlAs), indium arsenide (InAs), and gallium arsenide antimonide (GaAsSb). The first substrate with such epitaxial layers would typically be InP, which has poor thermal characteristics, though many other materials might be used.

Figure 4A:
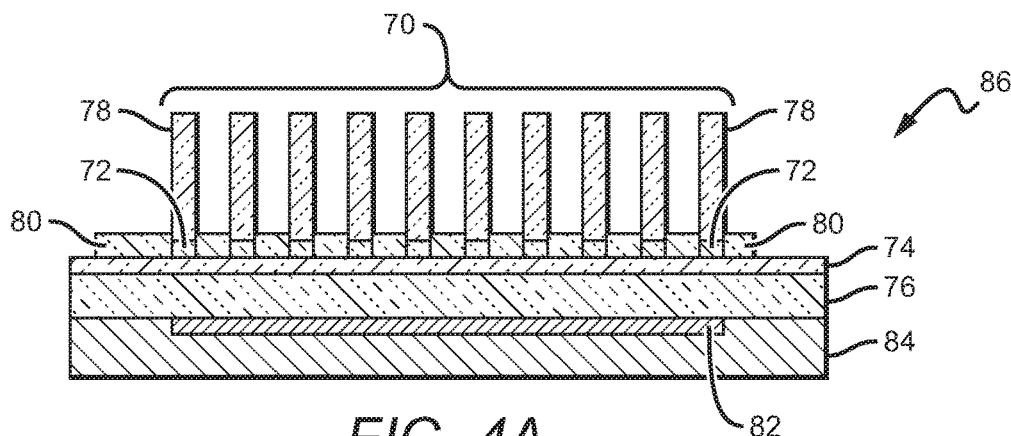
FIG. 4A is a sectional view of a plurality of transistors, each comprising a plurality of epitaxial semiconductor layers, after being transferred to a common host substrate with a common metal collector contact.

The present method is useful for transferring one transistor from a first to a host substrate, but would more practically be used to transfer a plurality of transistors onto a common host substrate. This technique can be used to form discrete isolated transistors or to form multi-finger transistors, which are often used in power amplifier designs. This can be accomplished in several ways. For example, in FIG. 4A, a plurality of transistors 70 comprising a plurality of epitaxial semiconductor layers on a first substrate—here consisting of emitters 72, a common base layer 74, a common collector layer 76, emitter contacts 78, and base contacts 80—are transferred onto a common metal collector contact 82 which has been formed in an opening etched into the top surface of a host substrate 84, thereby forming a multi-finger transistor 86. A collector contact so formed is preferably planarized prior to the transfer. In this example, collector contact 82 is formed in an opening etched into the top surface of host substrate 84, though the collector contact might alternately be embedded in an electrically insulating dielectric layer as discussed above in connection with FIG. 2B. Similarly, though FIG. 4A depicts transistors 70 having emitter, base, and collector layers, transistors having a sub-collector layer may also be employed.

Figure 5A:
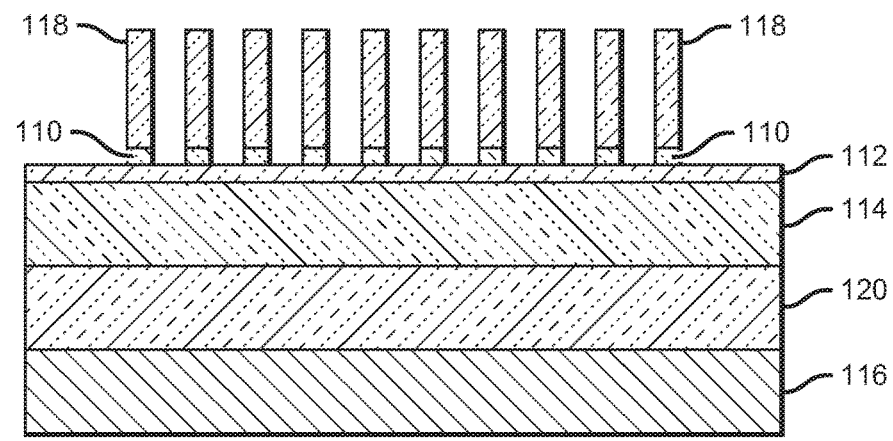
FIGS. 5A-5H illustrate one possible process sequence which could be used to form a multi-finger transistor, suitably an HBT, in accordance with the present method.

One possible process sequence which could be used to form a multi-finger transistor, suitably an HBT, in accordance with the present method is shown in FIGS. 5A-5H. In FIG. 5A, a structure is provided or formed which includes a plurality of emitters 110, a common base layer 112, and a common collector layer 114, epitaxially grown on a first substrate 116. Emitter contacts 118 are preferably provided or formed on respective emitters 110. A sacrificial etch layer 120 is preferably provided between first substrate 116 and common collector layer 114, to simplify the subsequent step of removing first substrate 116 from layers 110, 112, and 114 (discussed below).

Figure 5B:
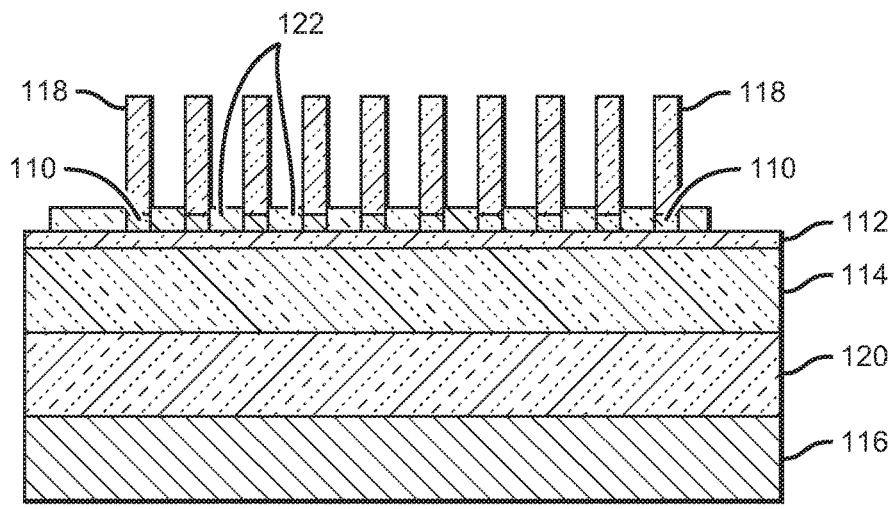
Figure 5C:
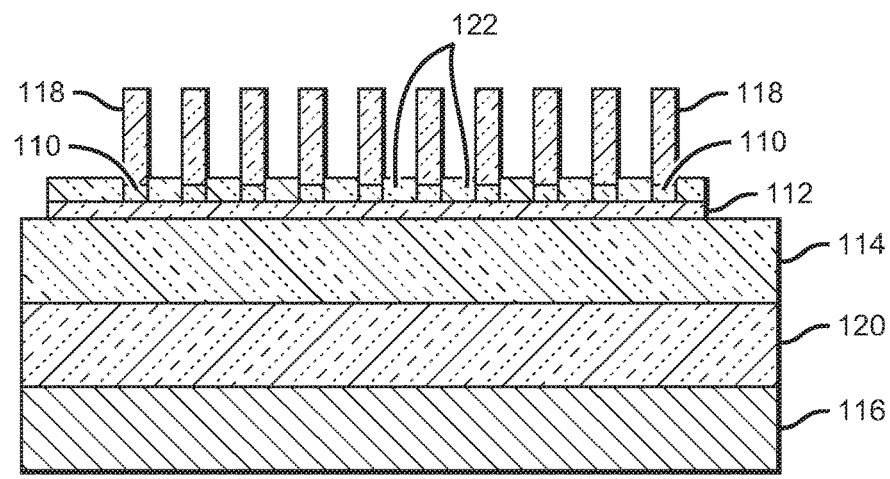

In FIG. 5B, base contacts 122 are defined on common base layer 112, and in FIG. 5C layer 112 is patterned and etched to provide base mesa isolation, if desired.

Figure 5D:
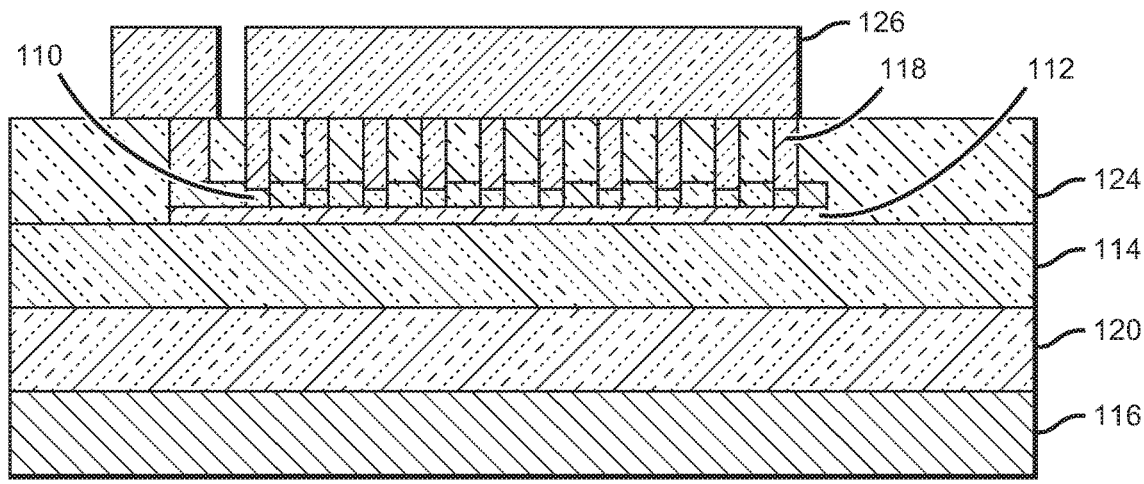
Figure 5E:
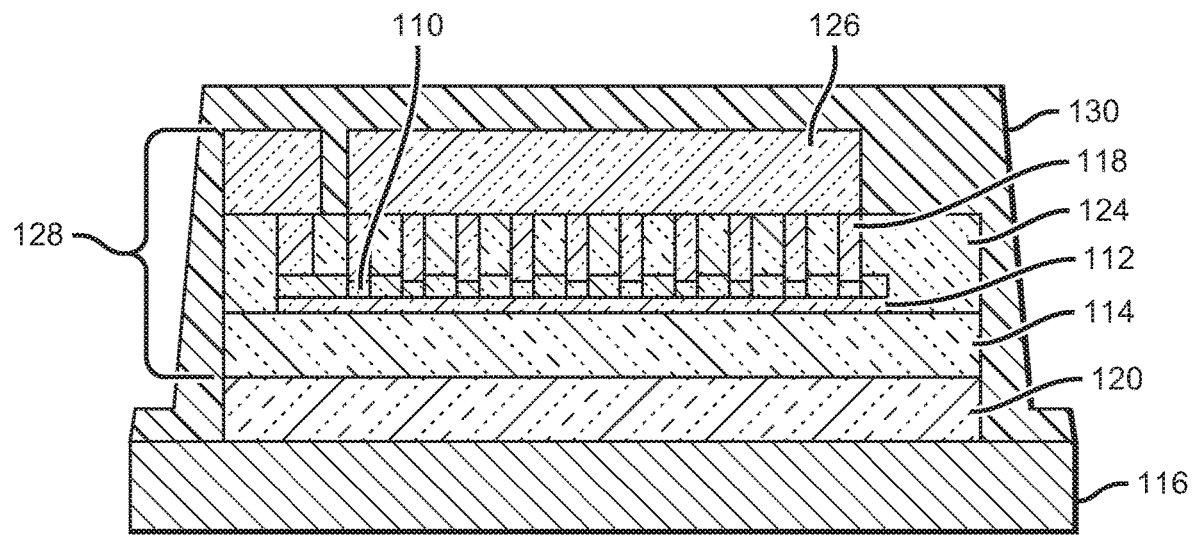

In FIG. 5D, a layer such as a BCB dielectric layer 124 would typically be provided on which device interconnections 126 can be formed. Then in FIG. 5E, BCB layer 124 may be patterned and a mesa etch performed, with the remaining structure—mesa 128—then encapsulated using, for example, a polymer (polymer strap) 130.

Figure 5F:
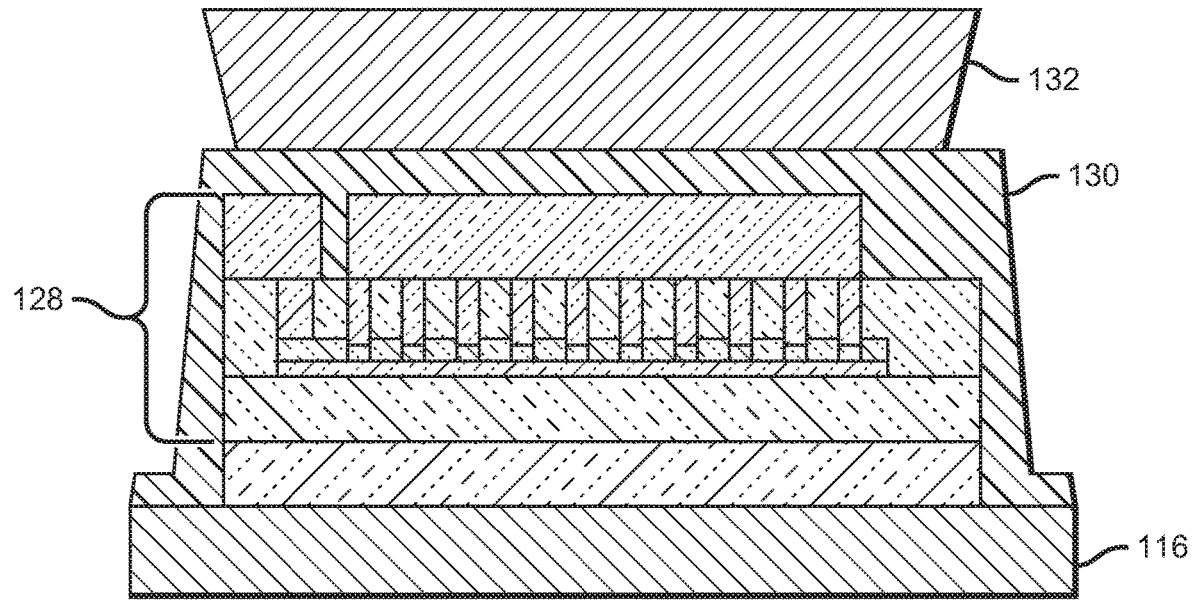

In FIG. 5F, a stamp 132 is preferably affixed to the top surface of polymer strap 130, and the transistor mesa 128 is separated from first substrate 116—preferably by performing an etch release using a sacrificial etch layer such as layer 120.

Figure 5G:
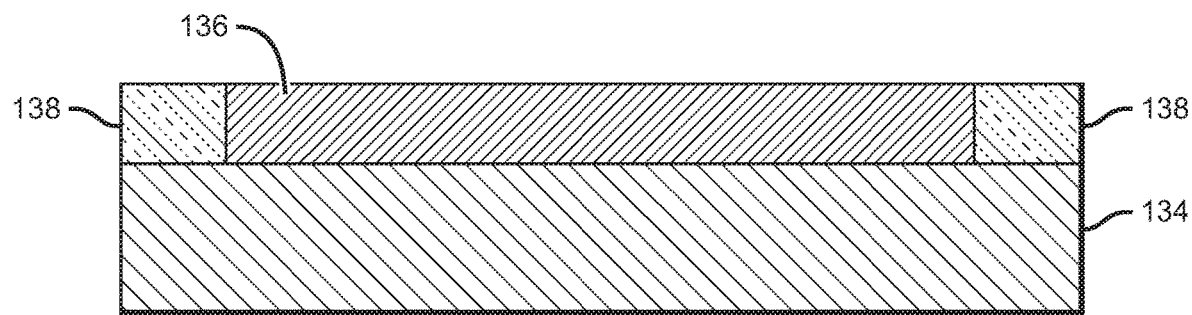

In FIG. 5G, a host substrate 134 is prepared, with a metal collector contact 136 formed on the host substrate's top surface. In the example shown, collector contact 136 is embedded in an opening formed in a dielectric layer 138, suitably made from $SiO_2$. As noted above, collector contact 136 might alternatively be formed in an opening etched into the top surface of host substrate 134. It should be self-evident that a host substrate can be prepared independently of the other steps in the illustrated process; i.e., it is not required that a host substrate be prepared between the steps shown in FIGS. 5F and 5H.

Figure 5H:
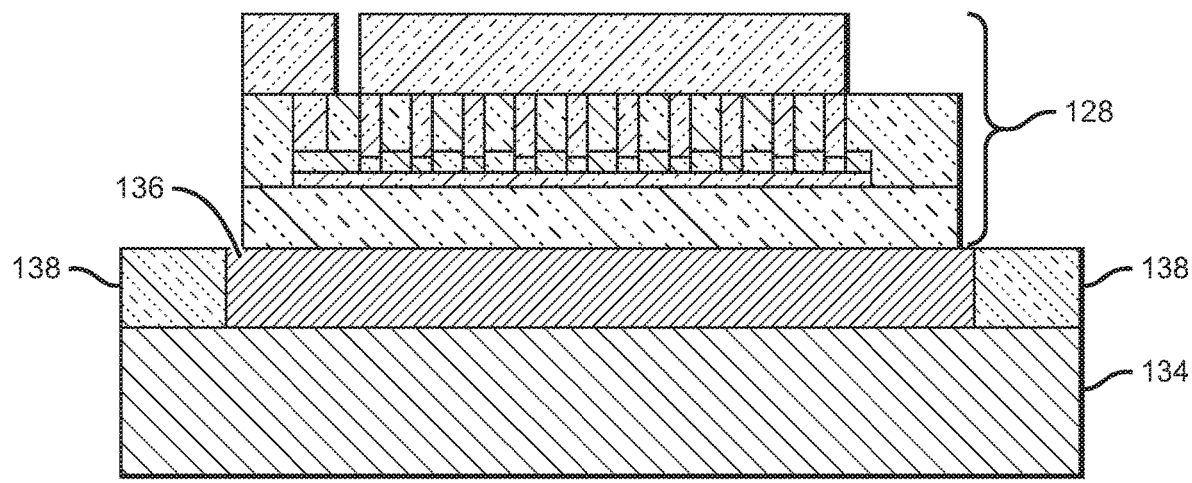

In FIG. 5H, mesa 128 is transferred onto metal collector contact 136 on host substrate 134, and the polymer encapsulation 130 is removed. Assuming host substrate 134 has a higher thermal conductivity than does first substrate 116, the device's heat dissipation characteristics will be improved. As noted above, this allows the transistors to operate at higher power densities ($W/cm^2$) when compared with conventional designs, which enables the device to have a more compact footprint than existing designs, or to provide more performance (output power or functionality) in a constrained area.

The present method also enables multi-finger transistors to be designed with no lateral collector contacts required. This can greatly increase the unit power-cell power density without a penalty in collector access resistance that would otherwise impact efficiency. Additionally, transistor footprint can be substantially reduced with the elimination of lateral collector contacts.

The transfer of the epitaxial layers from a first substrate to a host substrate can be accomplished in a number of different ways. One way in which the transfer can be effected is with the use of microtransfer printing. In one example of this process, a polydimethylsiloxane (PDMS) stamp is used to pick-up HBT epitaxy prepared in the manner of FIG. 5F. The HBT epitaxy cart then be placed on the host substrate. The microtransfer printing process relies on the rate-sensitive adhesion of the stamp head to the device to perform the pick-up and placement of device. This sensitivity comes from the viscoelastic behavior of the PDMS polymer. The microtransfer printing process can be used to pick up single HBTs or arrays of HBTs and eliminates the planarity requirements of full-wafer bonding processes. The process allows for the efficient use of HBT epitaxy from a donor substrate in a batch fabrication process.

The patterned collector contact preferably has a substantial thickness. A thick-patterned collector contact metal can be realized using chemo-mechanical polishing (CMP) processes while maintaining wafer planarity. Thick metal is preferred as it improves current handling and heatsinking. The present process is compatible with existing HBT process flows and epitaxy designs, with the addition of one or more sacrificial etch layers underneath the epi layers.

The present process can be used to, for example, improve output power and efficiency in microwave and millimeter wave power amplifiers. It can also be used to improve transistor density in mixed-signal circuits, to provide improvements in speed, bandwidth and dynamic range.

Note that one can have a plurality of single-finger transistors (as shown, for example, in FIGS. 2B, 2C, and 3B) and multi-finger transistors (as shown, for example, in FIG. 4A) deposited on the host substrate on separate collector contacts. This could be done in a single transfer step or in multiple steps. Integrated circuits of different functionality can then be realized by wiring those transistors together.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A method of forming a bipolar transistor with a vertical collector contact, comprising:
   providing a transistor comprising a plurality of epitaxial semiconductor layers on a first substrate;
   providing a host substrate;
   patterning a metal collector contact on the top surface of said host substrate; and
   transferring said plurality of epitaxial semiconductor layers from said first substrate directly onto said metal collector contact on said host substrate such that one of said plurality of epitaxial semiconductor layers is in direct contact with said metal collector contact.

2. The method of claim 1, wherein said plurality of epitaxial semiconductor layers comprises emitter, base, and collector layers, said collector layer on said metal collector contact such that a Schottky contact is formed.

3. The method of claim 2, wherein said collector layer comprises an $N^-$ material.

4. The method of claim 1, wherein said plurality of epitaxial semiconductor layers comprises emitter, base, collector, and sub-collector layers, said sub-collector layer on said metal collector contact such that an ohmic contact is formed.

5. The method of claim 4, wherein said sub-collector layer comprises an $N^{++}$ material.

6. The method of claim 1, wherein said plurality of epitaxial semiconductor layers form a heterojunction bipolar transistor (HBT).

7. The method of claim 1, wherein said transferring comprises transferring local areas of epitaxy from the first substrate to the host substrate.

8. The method of claim 1, wherein said plurality of epitaxial semiconductor layers on a first substrate further comprises a sacrificial etch layer between said epitaxial semiconductor layers and said first substrate, said transferring comprising:
   encapsulating said epitaxial semiconductor layers and said sacrificial etch layer in a polymer;
   etching said sacrificial etch layer to release said epitaxial semiconductor layers from said first substrate;
   using a stamp to move said released, encapsulated epitaxial semiconductor layers onto said metal collector contact on said host substrate; and
   removing said polymer encapsulation.

9. The method of claim 1, wherein said providing a transistor comprises providing a plurality of said transistors, and said transferring comprises transferring a plurality of said transistors onto a common host substrate.

10. The method of claim 9, wherein said plurality of said transistors are transferred onto a common metal collector contact which has been patterned on the top surface of said host substrate, thereby forming a multi-finger transistor.

11. The method of claim 9, wherein said plurality of said transistors are transferred onto respective metal collector contacts which have been patterned on the top surface of said host substrate, thereby forming a multi-finger transistor.

12. The method of claim 1, wherein said host substrate has a higher thermal conductivity than does said first substrate.

13. The method of claim 12, wherein said host substrate comprises silicon (Si), silicon carbide (SiC), aluminum nitride (AlN), or diamond.

14. The method of claim 1, wherein said plurality of epitaxial semiconductor layers comprise Group III-V materials.

15. The method of claim 1, wherein said plurality of epitaxial semiconductor layers comprises a combination of: indium phosphide (InP), indium gallium arsenide (InGaAs), indium aluminum arsenide (InAlAs), indium arsenide (InAs), and gallium arsenide antimonide (GaAsSb).

16. The method of claim 1, wherein said plurality of epitaxial semiconductor layers comprises emitter, base, and collector layers, further comprising fabricating electrical contacts to said emitter and base layers after said transferring of said plurality of epitaxial semiconductor layers from said first substrate onto said metal collector contact on said host substrate.

17. The method of claim 1, wherein said plurality of epitaxial semiconductor layers comprises emitter, base, and collector layers, further comprising fabricating electrical contacts to said emitter and base layers prior to said transferring of said plurality of epitaxial semiconductor layers from said first substrate onto said metal collector contact on said host substrate.

18. The method of claim 1, wherein said first substrate is the growth substrate for said plurality of epitaxial semiconductor layers.

19. A method of forming a bipolar transistor with a vertical collector contact, comprising:
    providing a transistor comprising a plurality of epitaxial semiconductor layers on a first substrate;
    providing a host substrate;
    patterning a metal collector contact on the top surface of said host substrate; and
    transferring said plurality of epitaxial semiconductor layers from said first substrate onto said metal collector contact on said host substrate;
    wherein said metal collector contact is embedded in an electrically insulating dielectric layer on the surface of the host substrate such that the surface of the metal collector contact is approximately level with the top surface of the electrically insulating dielectric layer.

20. The method of claim 19, further comprising:
    patterning and etching said electrically insulating dielectric layer to form openings; and
    depositing metal into said openings to form said metal collector contact.

21. The method of claim 20, further comprising planarizing said metal collector contact using chemo-mechanical polishing (CMP).

22. A method of forming a bipolar transistor with a vertical collector contact, comprising:
    providing a transistor comprising a plurality of epitaxial semiconductor layers on a first substrate;
    providing a host substrate;
    patterning a metal collector contact on the top surface of said host substrate; and
    transferring said plurality of epitaxial semiconductor layers from said first substrate onto said metal collector contact on said host substrate;
    further comprising etching an opening into said top surface of said host substrate and forming said metal collector contact in said opening.

* * * * *